United States Patent
Tain et al.

(10) Patent No.: US 8,004,079 B2
(45) Date of Patent: Aug. 23, 2011

(54) CHIP PACKAGE STRUCTURE AND MANUFACTURING METHOD THEREOF

(75) Inventors: Ra-Min Tain, Taipei County (TW); Yu-Lin Chao, Hsinchu (TW); Shu-Jung Yang, Tainan County (TW); Rong-Chang Fang, Hsinchu (TW); Wei Li, Hsinchu (TW); Chih-Yuan Cheng, Taipei County (TW); Ming-Che Hsieh, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 177 days.

(21) Appl. No.: 12/464,873

(22) Filed: May 13, 2009

(65) Prior Publication Data
US 2009/0294947 A1   Dec. 3, 2009

(30) Foreign Application Priority Data
May 29, 2008   (TW) .............................. 97119943 A

(51) Int. Cl.
*H01L 23/10* (2006.01)
*H01L 23/34* (2006.01)
(52) U.S. Cl. ........................................ 257/707; 257/706
(58) Field of Classification Search .................. 257/706, 257/707, 712, 713, 698
See application file for complete search history.

(56) References Cited

U.S. PATENT DOCUMENTS

| | | | | |
|---|---|---|---|---|
| 4,739,448 | A * | 4/1988 | Rowe et al. | 361/719 |
| 5,397,917 | A * | 3/1995 | Ommen et al. | 257/698 |
| 5,583,377 | A * | 12/1996 | Higgins, III | 257/707 |
| 6,265,771 | B1 | 7/2001 | Ference et al. | |
| 6,716,676 | B2 | 4/2004 | Chen et al. | |
| 7,683,469 | B2 * | 3/2010 | Oh et al. | 257/686 |
| 7,781,882 | B2 * | 8/2010 | Zhong et al. | 257/707 |
| 2002/0084524 | A1 * | 7/2002 | Roh et al. | 257/738 |
| 2010/0224978 | A1 * | 9/2010 | Shim et al. | 257/686 |
| 2011/0001230 | A1 * | 1/2011 | Li et al. | 257/693 |

* cited by examiner

*Primary Examiner* — S. V Clark
(74) *Attorney, Agent, or Firm* — Jianq Chyun IP Office

(57) ABSTRACT

A chip package structure includes a substrate, a chip, a thermal conductive layer, a plurality of signal contacts, and a molding compound. The substrate includes a plurality of first thermal conductive vias, a connecting circuit, and a plurality of signal vias electrically connected to the connecting circuit, and the substrate has a chip disposing region. The chip is disposed on the chip disposing region of the substrate and electrically connected to the signal vias through the connecting circuit. The thermal conductive layer is disposed over the substrate, connected to the first thermal conductive vias, and located above the chip disposing region. Besides, the thermal conductive layer has first openings exposing the signal vias. The signal contacts are respectively disposed in the first openings and connected to the signal vias. The molding compound encapsulates the chip.

34 Claims, 7 Drawing Sheets

CHIP PACKAGE STRUCTURE AND MANUFACTURING METHOD THEREOF

CROSS-REFERENCE TO RELATED APPLICATION

This application claims the priority benefit of Taiwan application serial no. 97119943, filed on May 29, 2008. The entirety of the above-mentioned patent application is hereby incorporated by reference herein and made a part of specification.

BACKGROUND

1. Technical Field

The present invention relates to a chip package structure and a manufacturing method thereof. More particularly, the present invention relates to a chip package structure and a manufacturing method both being capable of accomplishing favorable heat dissipating efficacy and improving manufacturing yield.

2. Description of Related Art

With rapid advance in technologies, integrated circuits (ICs) have been extensively used in out daily lives. Typically, IC manufacturing can be roughly classified into three main stages: a silicon wafer fabrication stage, an IC fabrication stage, and an IC package stage.

At present, a technique by applying which a plurality of chips are stacked and then packaged has been developed. Nonetheless, the chip stacked structure frequently encounters an issue of unsatisfactory heat dissipation, which further restricts the number of the stacked chips. Moreover, during a process of packaging the chips, the chips are first stacked and then packaged, which is apt to result in unfavorable production yield.

SUMMARY

In an exemplary embodiment, a chip package structure includes a substrate, a chip, a thermal conductive layer, a plurality of signal contacts, and a molding compound. The substrate includes a plurality of first thermal conductive vias, a connecting circuit, and a plurality of signal vias electrically connected to the connecting circuit, and the substrate has a chip disposing region. The chip is disposed on the chip disposing region of the substrate and electrically connected to the signal vias through the connecting circuit. The thermal conductive layer is disposed over the substrate, connected to the first thermal conductive vias, and located above the chip disposing region. Besides, the thermal conductive layer has first openings exposing the signal vias. The signal contacts are respectively disposed in the first openings and connected to the signal vias. The molding compound encapsulates the chip.

In another exemplary embodiment, a manufacturing method of a chip package structure includes first forming a connecting circuit, a plurality of signal vias, and a plurality of first thermal conductive vias in a substrate. The signal vias are electrically connected to the connecting circuit, and the substrate has a chip disposing region. Next, a chip is provided on the chip disposing region of the substrate. The chip is connected to the signal vias through the connecting circuit. Thereafter, a thermal conductive layer is formed over the substrate. The thermal conductive layer is connected to the first thermal conductive vias and located above the chip disposing region. A molding compound is then formed around the chip.

In further another exemplary embodiment, a chip package structure includes a carrying board, a plurality of chip package units, a plurality of signal solder balls, and a plurality of thermal conductive solder balls. The carrying board includes a plurality of signal lines and has a carrying surface and a back surface opposite to each other. The chip package units are sequentially stacked on the carrying surface of the carrying board. Each of the chip package units includes a substrate, a chip, a thermal conductive layer, a plurality of signal contacts, and a molding compound. The substrate includes a plurality of first thermal conductive vias, a connecting circuit, and a plurality of signal vias connected to the connecting circuit, and the substrate has a chip disposing region. The chip is disposed on the chip disposing region of the substrate and electrically connected to the signal vias through the connecting circuit. The thermal conductive layer is disposed over the substrate, connected to the first thermal conductive vias, and located above the chip disposing region. Besides, the thermal conductive layer has first openings exposing the signal vias. The signal contacts are respectively disposed in the first openings and connected to the signal vias. The molding compound encapsulates the chip. The first thermal conductive vias in one of the chip package units located at an upper layer are connected to the thermal conductive layer in one of the chip package units located at a bottom layer, and the signal vias in the one of the chip package units located at the upper layer are connected to the signal contacts in the one of the chip package units located at the bottom layer. The signal solder balls and the thermal conductive solder balls are disposed on the back surface of the carrying board. Here, the signal solder balls are connected to the signal vias in one of the chip package units located at a bottommost layer through the signal lines.

In order to make the aforementioned and other features of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DETAILED DESCRIPTION OF DISCLOSED EMBODIMENTS

Figure 1A:
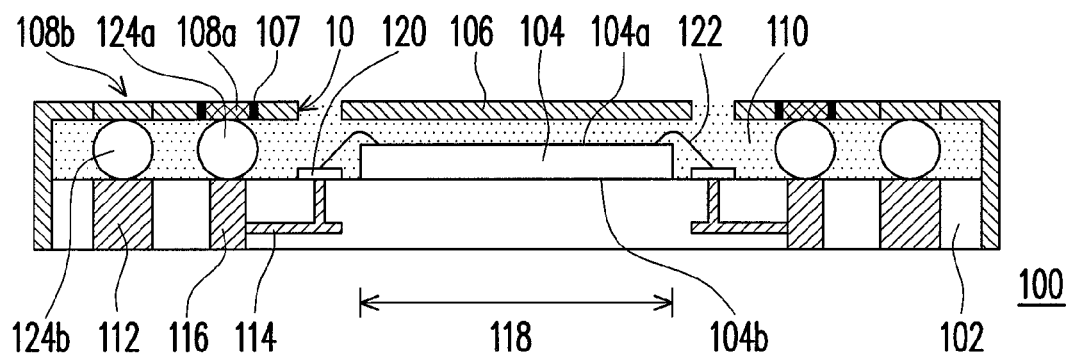
FIG. 1A is a schematic cross-sectional view of a chip package structure according to an exemplary embodiment.

FIG. 1A is a schematic cross-sectional view of a chip package structure according to an exemplary embodiment. Referring to FIG. 1A, the chip package structure 100 includes a substrate 102, a chip 104, a thermal conductive layer 106, signal contacts 108a, and a molding compound 110. The substrate 102 includes thermal conductive vias 112, a connecting circuit 114, and signal vias 116 electrically connected to the connecting circuit 114, and the substrate 102 has a chip disposing region 118. In the present embodiment, the connecting circuit 114 is, for example, an interconnect located in the substrate 102, while in other exemplary embodiments the connecting circuit 114 can also be located on the surface of the substrate 102. Besides, in the present embodiment, the thermal conductive vias 112 are, for example, located around the connecting circuit 114 and the signal vias 116. According to other exemplary embodiments, the thermal conductive vias 112 can also be disposed at other locations on the substrate 102 based on actual demands. The chip 104 is disposed on the chip disposing region 118 of the substrate 102 and electrically connected to the signal vias 116 through the connecting circuit 114. In detail, according to the exemplary embodiment shown in FIG. 1A, the chip 104 has an active surface 104a and a back surface 104b. The back surface 104b of the chip 104 is disposed on the chip disposing region 118 of the substrate 102 and the chip 104 is connected to the connecting circuit 114 through solder pads 120 and conductive wires 122 by wire bonding.

The illustrated connecting circuit 114 of the present embodiment or the subsequent embodiments is merely exemplary. The connecting circuit 114 in practice may include a plurality of circuit layers in the substrate 102 and thus have a relatively complicated circuit structure.

The thermal conductive layer 106 is disposed over the substrate 102, connected to the thermal conductive vias 112, and located above the chip disposing region 118. In the exemplary embodiment shown in FIG. 1A, the thermal conductive layer 106 is located over a top surface and a side surface of the substrate 102, so as to accomplish favorable heat dissipating efficacy. Certainly, in other exemplary embodiments, the thermal conductive layer 106 can also be merely located over the top surface of the substrate 102. Besides, the thermal conductive layer 106 has openings in which the signal contacts 108a are disposed. To be more specific, in the exemplary embodiment shown in FIG. 1A, the signal contacts 108a are connected to the signal vias 116 through bumps 124a. Note that insulation layers 107 are required to be disposed between the signal contacts 108a and the thermal conductive layer 106, so as to prevent the signal contacts 108a from being electrically connected to the thermal conductive layer 106. Additionally, the thermal conductive layer 106 is connected to the thermal conductive vias 112 through bumps 124b, and contact areas between the thermal conductive layer 106 and the bumps 124b can be regarded as thermal conductive contacts 108b.

Moreover, the molding compound 110 is filled into the space between the substrate 102 and the thermal conductive layer 106 through openings 10, so as to encapsulate the chip 104.

Figure 1B:
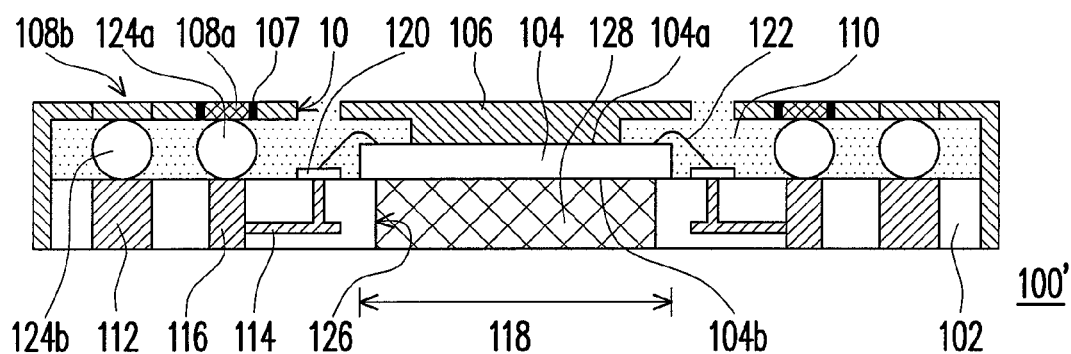
FIG. 1B is a schematic cross-sectional view of a chip package structure according to another exemplary embodiment.

FIG. 1B is a schematic cross-sectional view of a chip package structure according to another exemplary embodiment. Referring to FIG. 1B, in the chip package structure 100', the chip disposing region 118 of the substrate 102 has an opening 126 exposing at least a portion of the back surface 104b of the chip 104. Besides, a heat sink 128 is disposed in the opening 126 and connected to the back surface 104b of the chip 104, which is conducive to an increase in heat dissipating capacity of the chip package structure 100'. Note that in the exemplary embodiment depicted in FIG. 1B, the thermal conductive layer 106 contacts the active surface 104a of the chip 104, thus further improving heat dissipating efficacy. In other exemplary embodiments (not shown), the thermal conductive layer 106 can also be in no contact with the active surface 104a of the chip 104. Except for the above, other components in the chip package structure 100' are the same as those depicted in FIG. 1A, and therefore descriptions of these components are omitted. It is certain that the thermal conductive layer 106 can also contact the active surface 104a of the chip 104 for improving heat dissipating efficacy in other exemplary embodiments (not shown) similar to the exemplary embodiment shown in FIG. 1A.

Figure 1C:
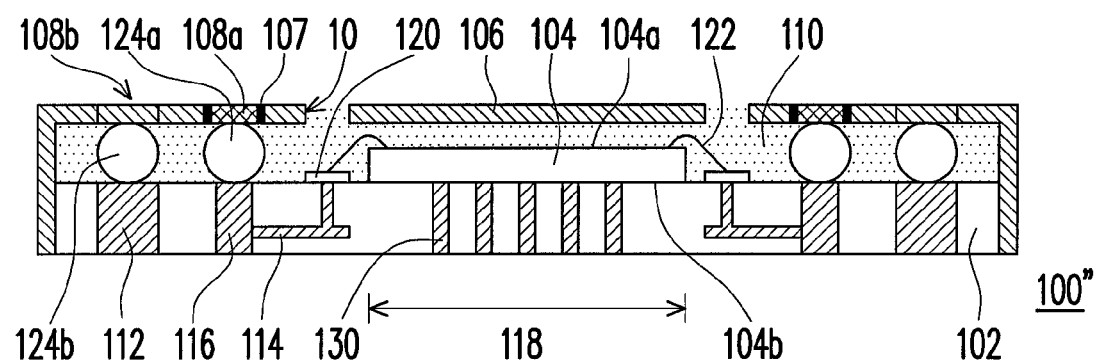
FIG. 1C is a schematic cross-sectional view of a chip package structure according to still another exemplary embodiment.

FIG. 1C is a schematic cross-sectional view of a chip package structure according to still another exemplary embodiment. Referring to FIG. 1C, in the chip package structure 100", the chip disposing region 118 of the substrate 102 has thermal conductive vias 130 connected to the back surface 104b of the chip 104, so as to improve heat dissipating capacity of the chip package structure 100". Except for the above, other components in the chip package structure 100" are the same as those depicted in FIG. 1A, and therefore descriptions of these components are omitted. It is certain that the thermal conductive layer 106 can also contact the active surface 104a of the chip 104 for improving heat dissipating efficacy in other exemplary embodiments (not shown) similar to the exemplary embodiment shown in FIG. 1C.

Figure 1D:
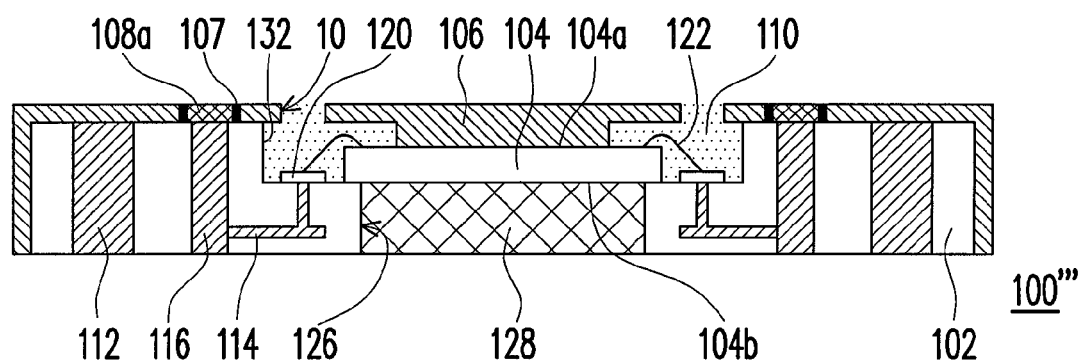
FIG. 1D is a schematic cross-sectional view of a chip package structure according to yet still another exemplary embodiment.

FIG. 1D is a schematic cross-sectional view of a chip package structure according to yet still another exemplary embodiment of the present invention. Referring to FIG. 1D, in the chip package structure 100''', the chip disposing region is a concave 132, and the back surface 104b of the chip 104 is disposed on a bottom surface of the concave 132. The thermal conductive layer 106 is connected to the thermal conductive vias 112. The signal contacts 108a are connected to the signal vias 116, and the insulation layers 107 are disposed between the signal contacts 108a and the thermal conductive layer 106. Besides, the substrate 102 located at the bottom of the concave 132 has an opening 126 exposing at least a portion of the back surface 104b of the chip 104. A heat sink 128 is disposed in the opening 126 and connected to the back surface 104b of the chip 104, which is conducive to an increase in heat dissipating capacity of the chip package structure 100'''. On the other hand, the thermal conductive layer 106 contacts the active surface 104a of the chip 104, which also results in improvement of heat dissipating efficacy. Certainly, in other exemplary embodiments (not shown) similar to the exemplary embodiment shown in FIG. 1D, the substrate 102 located below the chip 104 can have no opening 126 and heat sink 128. Alternatively, the substrate 102 located below the chip 104 can be equipped with no opening 126 and heat sink 128 but equipped with thermal conductive vias connected to the back surface 104b of the chip 104. It is also likely for the thermal conductive layer 106 not to contact the active surface 104a of the chip 104.

It is noted that the aforementioned thermal conductive vias 112 and 130 and signal vias 116 can be a solid structure substantially formed by a conductive material or a hollow structure comprising a cylindrical conductive wall filled by an insulating material. However, there provides no limitations on the profiles of the thermal conductive vias or signal vias in the mentioned or other exemplary embodiments.

The afore-mentioned chip package structures can also be disposed on a carrying board. The chip package structure 100' depicted in FIG. 1B serve to exemplify the present invention as described below.

Figure 2:
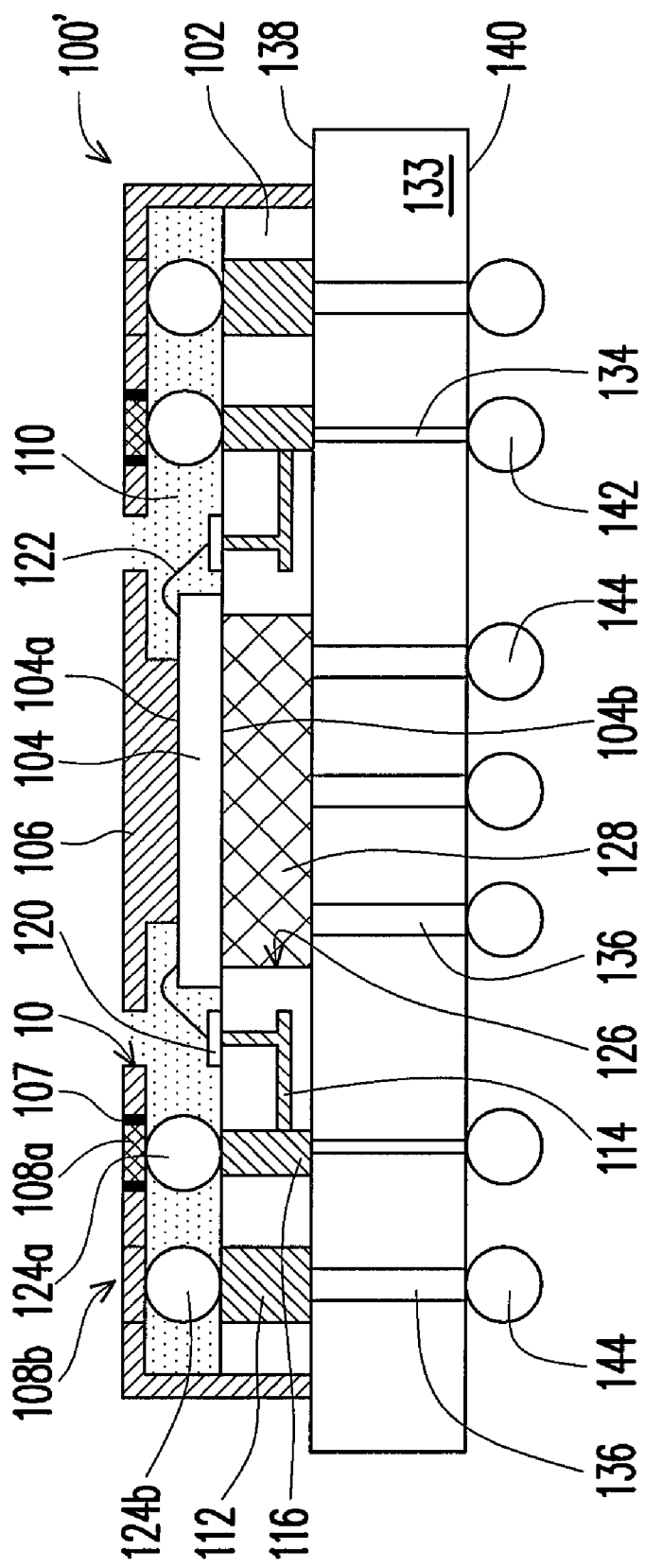
FIG. 2 is a schematic cross-sectional view of the chip package structure that is depicted in FIG. 1A and disposed on a carrying board.

FIG. 2 is a schematic cross-sectional view of the chip package structure that is depicted in FIG. 1B and disposed on a carrying board. Referring to FIG. 2, the chip package structure 100' is disposed on a carrying board 133. The carrying board 133 is, for example, a printed circuit board in which signal lines 134 and thermal conductive elements 136 are disposed. Besides, the carrying board 133 has a carrying surface 138 and a back surface 140 opposite to each other. The thermal conductive elements 136 refer to connecting circuits or vias disposed in the carrying board 133, for example. Signal solder balls 142 and thermal conductive solder balls 144 are disposed on the back surface 140 of the carrying board 138. The signal solder balls 142 are connected to the signal vias 116 through the signal lines 134, such that signals in the chip package structure 100' can be transmitted outwardly, or external signals can be received. The thermal conductive solder balls 144 are connected to the thermal conductive elements 136. In the embodiment shown in FIG. 1B, the heat sink 128 and the thermal conductive vias 112 are connected to the thermal conductive elements 136 depicted in FIG. 2, respectively. Thereby, the chip package structure 100' can dissipate heat to external environment through the thermal conductive solder balls 144.

In addition, given that the chip package structure 100 depicted in FIG. 1A is disposed on the carrying board 133, the thermal conductive elements 136 are respectively connected to the substrate 102 and the thermal conductive vias 112. Suppose that the chip package structure 100'' depicted in FIG. 1C is disposed on the carrying board 133, the thermal conductive elements 136 are respectively connected to the thermal conductive vias 130 and the thermal conductive vias 112. Provided that the chip package structure 100''' depicted in FIG. 1D is disposed on the carrying board 133, the thermal conductive elements 136 are respectively connected to the heat sink 128 and the thermal conductive vias 112.

In the above-mentioned exemplary embodiments, the chip is disposed in the chip disposing region by wire bonding, while the chip is disposed in the chip disposing region by flip chip bonding according to the following exemplary embodiments.

Figure 3A:
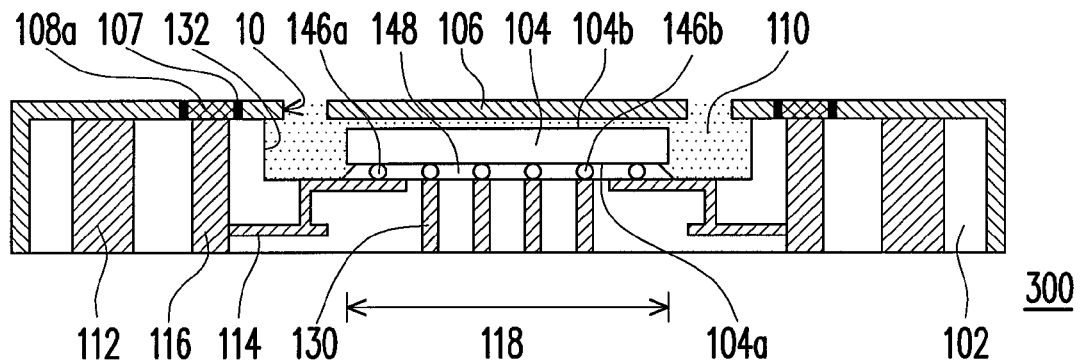
FIG. 3A is a schematic cross-sectional view of a chip package structure according to yet still another exemplary embodiment.

FIG. 3A is a schematic cross-sectional view of a chip package structure according to yet still another exemplary embodiment. Referring to FIG. 3A, in the chip package structure 300, the chip disposing region refers to the concave 132. The active surface 104a of the chip 104 faces toward the bottom surface of the concave 132 and connects the connecting circuit 114 through bumps 146a. Besides, the chip 104 is connected to the thermal conductive vias 130 through bumps 146b, such that heat can be dissipated. On the other hand, an underfill 148 is disposed between the chip 104 and the bottom surface of the concave 132, so as to encapsulate the bumps 146a and 146b. Except for the above, other components in the chip package structure 300 are the same as those depicted in FIG. 1D, and therefore descriptions of these components are omitted.

Figure 3B:
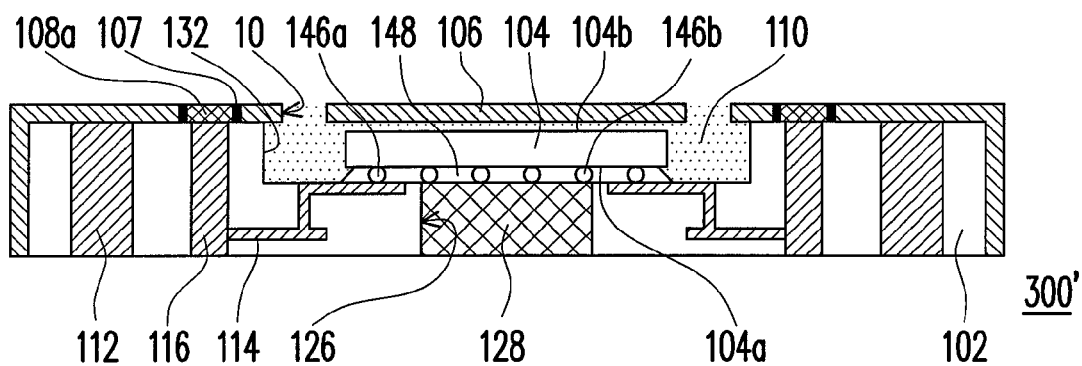
FIG. 3B is a schematic cross-sectional view of a chip package structure according to yet still another exemplary embodiment.

FIG. 3B is a schematic cross-sectional view of a chip package structure according to yet still another exemplary embodiment. Referring to FIG. 3B, the difference between the chip package structure 300' and the chip package structure 300 lies in that the substrate 102 located below the chip 104 is not equipped with the thermal conductive vias 130 but equipped with the opening 126 in the chip package structure 300'. Besides, the heat sink 128 in the chip package structure 300' is disposed in the opening 126 and connected to the bumps 146b for heat dissipation.

Likewise, in other exemplary embodiments (not shown) similar to those depicted in FIGS. 3A and 3B, the substrate 102 below the chip 104 can also have no opening 126 and heat sink 128 or have no thermal conductive vias 130. In an alternative, the thermal conductive layer 106 can contact the back surface 104b of the chip 104 for accomplishing favorable heat dissipating efficacy. The chip disposing region is also likely not to be the concave 132 but to be the same as the chip disposing region 118 depicted in FIGS. 1A to 1C.

Additionally, the chip package structure in which the chip is disposed through flip chip bonding can also be arranged on the carrying board, and the arrangement of such a chip package structure is similar to that depicted in FIG. 2. Thus, no further description is provided herein.

An exemplary embodiment of a manufacturing method of a chip package structure is described below by taking the chip package structure 100''' shown in FIG. 1D as an example.

FIGS. 4A-4D are schematic cross-sectional flowcharts illustrating a manufacturing process of a chip package structure according to an exemplary embodiment. First, referring to FIG. 4A, an opening 126 and a concave 132 acting as a chip disposing region are formed in a substrate 102. Next, thermal conductive vias 112, a connecting circuit 114, and signal vias 116 connected to the connecting circuit 114 are formed in the substrate 102. Besides, solder pads 120 connecting the connecting circuit 114 are formed at the bottom of the concave 132. Here, the thermal conductive vias 112 are located around the connecting circuit 114 and the signal vias 116.

Figure 4A:
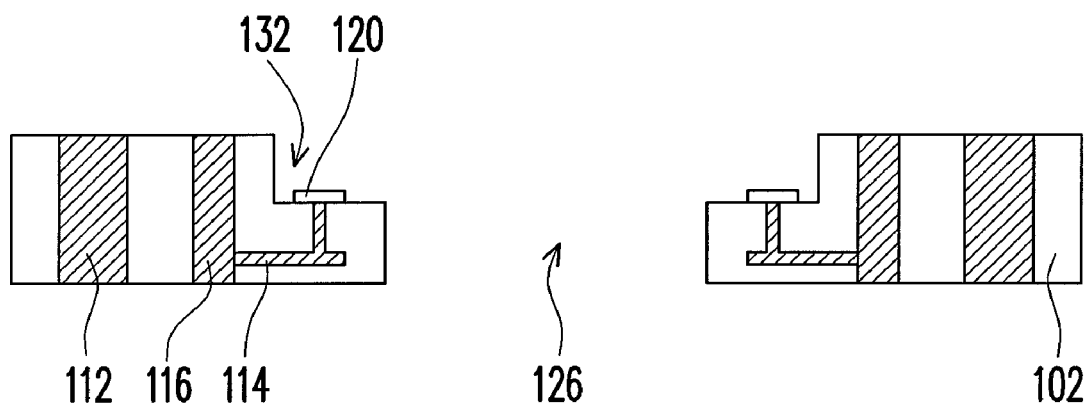
FIGS. 4A-4D are schematic cross-sectional flowcharts illustrating a manufacturing process of a chip package structure according to an exemplary embodiment.
Figure 4B:
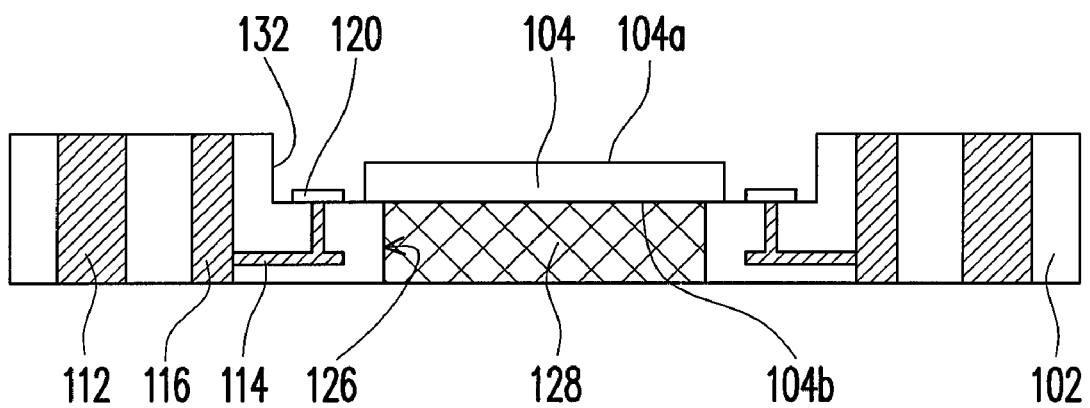

Thereafter, referring to FIG. 4B, a chip 104 is provided at the bottom of the concave 132. The chip 104 has an active surface 104a and a back surface 104b, and the back surface 104b of the chip 104 is disposed at the bottom of the concave 132. A heat sink 128 connected to the back surface 104b of the chip 104 is then provided in the opening 126.

Figure 4C:
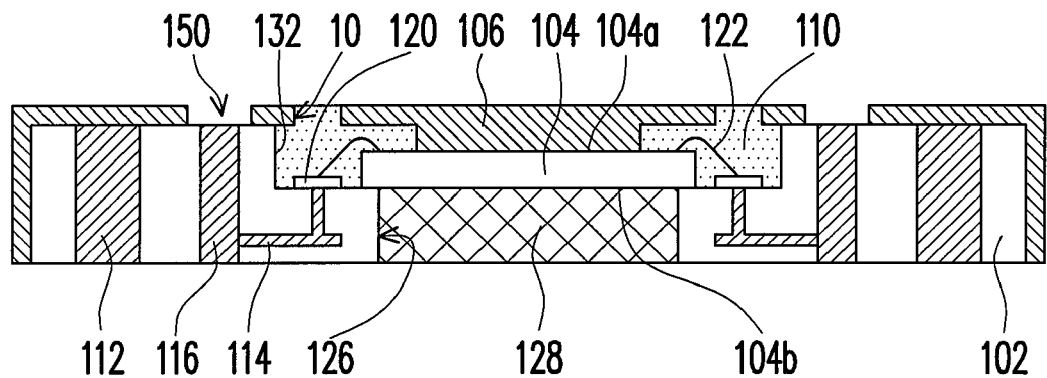

After that, referring to FIG. 4C, a wire bonding process is performed, such that the chip 104 is connected to the connecting circuit 114 through conductive wires 122 and the solder pads 120. Next, a thermal conductive layer 106 is formed over the substrate 102. The thermal conductive layer 106 is connected to the thermal conductive vias 112 and located over a top surface and a side surface of the substrate 102. Besides, openings 150 exposing the signal vias 116 are formed in the thermal conductive layer 106, and the thermal conductive layer 106 contacts the active surface 104a of the chip 104.

Figure 4D:
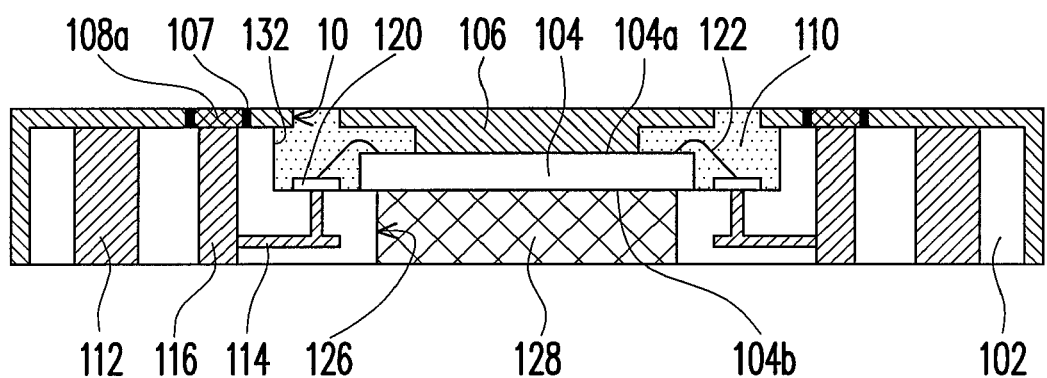

Afterwards, referring to FIG. 4D, signal contacts 108a connected to the signal vias 116 are formed in the openings 150. A molding compound 110 is then formed between the thermal conductive layer 106 and the substrate 102 through openings 10 to encapsulate the chip 104, such that the chip package structure of the exemplary embodiment is completely formed.

Undoubtedly, according to other exemplary embodiments that are not depicted herein, methods similar to the method shown in FIGS. 4A to 4D can also be applied to form the aforesaid chip package structures. For instance, in steps shown in FIG. 4A, the fabrication of the openings 126 and the concave 132 is omitted. Besides, prior to formation of the thermal conductive layer 106 as indicated in FIG. 4C, bumps 124a and 124b respectively connected to the thermal conductive vias 112 and the signal vias 116 are formed on the substrate 102, and the thermal conductive layer 106 does not contact the chip 104. Thereby, the chip package structure 100 shown in FIG. 1A can be formed.

Additionally, in steps shown in FIG. 4A, the fabrication of the concave 132 is omitted. Besides, prior to formation of the thermal conductive layer 106 as indicated in FIG. 4C, bumps 124a and 124b respectively connected to the thermal conductive vias 112 and the signal vias 116 are formed on the substrate 102. Thereby, the chip package structure 100' shown in FIG. 1B can be formed.

Moreover, in steps shown in FIG. 4A, the fabrication of the concave 132 is omitted, and thermal conductive vias 130 connected to the back surface 104b of the chip 104 are additionally formed in the substrate 102. In addition, prior to formation of the thermal conductive layer 106 as indicated in FIG. 4C, bumps 124a and 124b respectively connected to the thermal conductive vias 112 and the signal vias 116 are formed on the substrate 102, and the thermal conductive layer 106 does not contact the chip 104. Thereby, the chip package structure 100''' shown in FIG. 1C can be formed.

Unquestionably, in the above-mentioned manufacturing methods, the chip 104 can be disposed through flip chip bonding known to people having ordinary skill in the art instead of through wire bonding, such that other types of chip package structures can be formed.

In the exemplary embodiments, any of the aforesaid chip package structures can be considered as a chip package unit, and a plurality of chip package units are sequentially stacked on the carrying surface of the carrying board, so as to form a package structure having a plurality of chip package units. The structure shown in FIG. 1D serve as an exemplary embodiment as described below.

Figure 5:
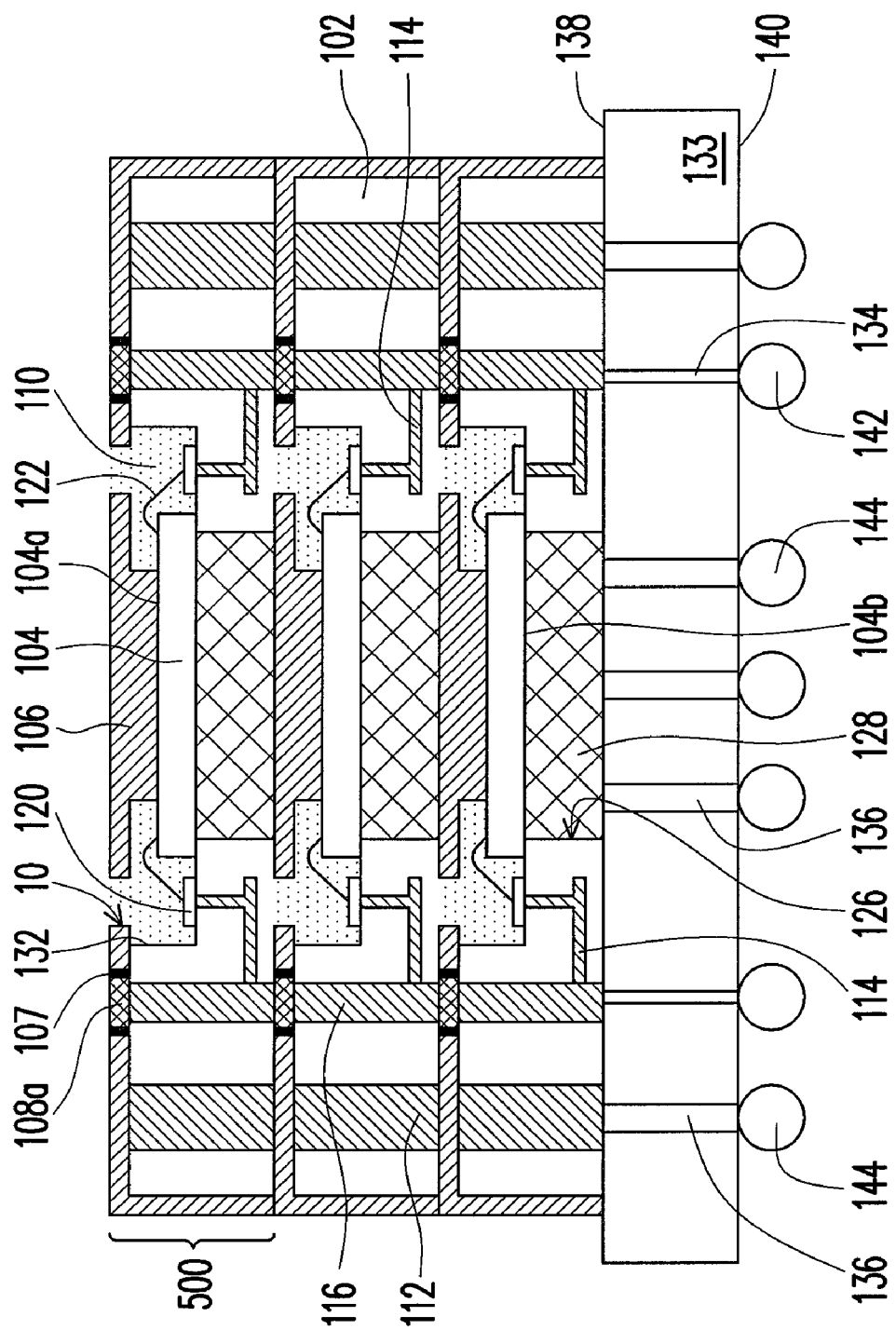
FIG. 5 is a schematic cross-sectional view of a chip package structure having stacked chip package units according to an exemplary embodiment.

FIG. 5 is a schematic cross-sectional view of a chip package structure having stacked chip package units according to an exemplary embodiment.

Referring to FIG. 5, the chip package units 500 (individually referred to as the chip package structure 100''' indicated in FIG. 1D) are sequentially stacked on the carrying surface 138 of the carrying board 133. The thermal conductive vias 112 of the upper chip package unit 500 are connected to the thermal conductive layer 106 of the lower chip package unit 500 adjacent to the upper chip package unit 500. Furthermore, the signal vias 116 of the upper chip package unit 500 are connected to the signal contacts 108a of the lower chip package unit 500. The signal vias 116 of the bottommost chip package unit 500 are connected to the signal lines 134 in the carrying board 133.

Additionally, the heat sink 128 of the upper chip package unit 500 is connected to the thermal conductive layer 106 of the lower chip package unit 500 adjacent to the upper chip package unit 500, and the heat sink 128 of the bottommost chip package unit 500 is connected to the thermal conductive elements 136 of the carrying board 133.

Certainly, according to other exemplary embodiments that are not shown herein, other types of chip package units can be stacked and disposed on the carrying board 133. For instance, if the chip package units 500 individually refer to the structure illustrated in FIG. 1A, the thermal conductive vias 112 and the signal vias 116 of the upper chip package unit 500 are respectively connected to the thermal conductive contacts 108b and the signal contacts 108a of the lower chip package unit 500.

Besides, if the chip package units 500 individually refer to the structure illustrated in FIG. 1B, the thermal conductive vias 112 and the signal vias 116 of the upper chip package unit 500 are respectively connected to the thermal conductive contacts 108b and the signal contacts 108a of the lower chip package unit 500.

Moreover, if the chip package units 500 individually refer to the structure illustrated in FIG. 1C, the thermal conductive vias 112 and the signal vias 116 of the upper chip package unit 500 are respectively connected to the thermal conductive contacts 108b and the signal contacts 108a of the lower chip package unit 500. The thermal conductive vias 130 of the substrate 102 of the upper chip package unit 500 are connected to the thermal conductive layer 106 of the lower chip package unit 500. The thermal conductive vias 130 of the bottommost chip package unit 500 are connected to the thermal conductive elements 136 of the carrying board 133.

Same or similar arrangement can also be applied to other types of chip package units stacked on the carrying board.

To sum up, in the aforementioned exemplary embodiment, the thermal conductive layer is disposed on the top surface and/or the side surface of the substrate, and therefore favorable heat dissipating efficacy of the chip package structure can be accomplished. Moreover, the signal vias passing through the thermal conductive layer are disposed around the chip according to the present invention. Hence, signals can pass through the thermal conductive layer and can then be transmitted.

The aforementioned chip package structure has the thermal conductive layer disposed on the top surface and/or the side surface of the substrate. Therefore, applying to the multi-chip stack package, favorable heat dissipating efficacy can be achieved.

Furthermore, the signal vias passing through conductive layers are disposed around the chip. Hence, applying to the multi-chip stack package, signals can be transmitted between the stacked chip package structures through the signal vias.

Additionally, a single chip is firstly packaged to form a chip package unit, and a plurality of chip package units are stacked to form a stacked chip package structure. Thereby, both manufacturing yield and package density can be effectively improved.

It will be apparent to those skilled in the art that various modifications and variations can be made to the structure of the exemplary embodiments without departing from the scope or spirit of the invention. In view of the foregoing, it is intended that the modifications and variations of these exemplary embodiments provided fall within the scope of the following claims and their equivalents.

What is claimed is:

1. A chip package structure, comprising:
   a substrate comprising a plurality of first thermal conductive vias, a connecting circuit, and a plurality of signal vias electrically connected to the connecting circuit, the substrate having a chip disposing region;
   a chip disposed on the chip disposing region of the substrate and electrically connected to the signal vias through the connecting circuit;
   a thermal conductive layer disposed over the substrate, connected to the first thermal conductive vias, and located above the chip disposing region, wherein the thermal conductive layer has a plurality of first openings exposing the signal vias;
   a plurality of signal contacts respectively disposed in the first openings and connected to the signal vias; and
   a molding compound encapsulating the chip.

2. The chip package structure as claimed in claim 1, wherein the thermal conductive layer is located over a top surface and a side surface of the substrate.

3. The chip package structure as claimed in claim 1, wherein the signal vias are solid structure or hollow structure.

4. The chip package structure as claimed in claim 1, wherein the first thermal conductive vias are solid structure or hollow structure.

5. The chip package structure as claimed in claim 1, wherein the chip has an active surface and a back surface, and the chip is disposed on the chip disposing region of the substrate via the back surface and connected to the connecting circuit via a plurality of conductive wires by wire bonding.

6. The chip package structure as claimed in claim 5, further comprising a heat sink, wherein the chip disposing region of the substrate has a second opening exposing at least a portion of the back surface of the chip, and the heat sink is disposed in the second opening and connected to the back surface of the chip.

7. The chip package structure as claimed in claim 5, wherein the substrate has a plurality of second thermal conductive vias located in the chip disposing region and connected to the back surface of the chip.

8. The chip package structure as claimed in claim 7, wherein the second thermal conductive vias are solid structure or hollow structure.

9. The chip package structure as claimed in claim 5, wherein the thermal conductive layer contacts the active surface of the chip.

10. The chip package structure as claimed in claim 1, wherein the chip has an active surface and a back surface, the active surface of the chip faces toward the chip disposing region of the substrate, and the chip connects the connecting circuit via a plurality of first bumps by flip chip bonding.

11. The chip package structure as claimed in claim 10, further comprising a heat sink, wherein the chip disposing region of the substrate has a second opening exposing at least a portion of the active surface of the chip, and the heat sink is disposed in the second opening and connected to the active surface of the chip through a plurality of second bumps.

12. The chip package structure as claimed in claim 10, wherein the substrate has a plurality of second thermal conductive vias located in the chip disposing region and connected to the active surface of the chip, and each second thermal conductive via is connected to the active surface of the chip through a second bump, respectively.

13. The chip package structure as claimed in claim 12, wherein the second thermal conductive vias are solid structure or hollow structure.

14. The chip package structure as claimed in claim 10, wherein the thermal conductive layer contacts the back surface of the chip.

15. The chip package structure as claimed in claim 1, wherein the first thermal conductive vias are located around the connecting circuit and the signal vias.

16. The chip package structure as claimed in claim 1, wherein the substrate is disposed on a carrying board provided with a plurality of signal lines and a plurality of thermal conductive elements therein, the carrying board having a carrying surface and a back surface opposite to each other, a plurality of signal solder balls and a plurality of thermal conductive solder balls being disposed on the back surface of the carrying board, wherein the signal solder balls are connected to the signal vias through the signal lines, and the thermal conductive solder balls are connected to the thermal conductive elements.

17. The chip package structure as claimed in claim 1, wherein the thermal conductive layer has a second opening for filling the molding compound.

18. A chip package structure, comprising:
a carrying board comprising a plurality of signal lines and having a carrying surface and a back surface opposite to each other;
a plurality of chip package units sequentially stacking on the carrying surface of the carrying board, each of the chip package units comprising:
a substrate comprising a plurality of first thermal conductive vias, a connecting circuit, and a plurality of signal vias connected to the connecting circuit, the substrate having a chip disposing region;
a chip disposed on the chip disposing region of the substrate and electrically connected to the signal vias through the connecting circuit;
a thermal conductive layer disposed over the substrate, connected to the first thermal conductive vias, and located above the chip disposing region, wherein the thermal conductive layer has a plurality of first openings exposing the signal vias;
a plurality of signal contacts respectively disposed in the first openings and connected to the signal vias; and
a molding compound encapsulating the chip,
wherein the first thermal conductive vias in one of the chip package units located at an upper layer are connected to the thermal conductive layer in one of the chip package units located at a bottom layer, and the signal vias in the one of the chip package units located at the upper layer are connected to the signal contacts in the one of the chip package units located at the bottom layer; and
a plurality of signal solder balls and a plurality of thermal conductive solder balls disposed on the back surface of the carrying board, wherein the signal solder balls are connected to the signal vias in one of the chip package units located at a bottommost layer through the signal lines.

19. The chip package structure as claimed in claim 18, wherein the thermal conductive layer of each of the chip package units is located over a top surface and a side surface of the substrate.

20. The chip package structure as claimed in claim 18, wherein the signal vias are solid structure or hollow structure.

21. The chip package structure as claimed in claim 18, wherein the first thermal conductive vias are solid structure or hollow structure.

22. The chip package structure as claimed in claim 18, wherein the chip of each of the chip package units has an active surface and a back surface, and the chip is disposed on the chip disposing region of the substrate via the back surface and connected to the connecting circuit via a plurality of conductive wires by wire bonding.

23. The chip package structure as claimed in claim 22, wherein each of the chip package units further comprises a heat sink, the substrate of each of the chip package units having a second opening in the chip disposing region for exposing at least a portion of the back surface of the corresponding chip, the heat sink being disposed in the second opening and connected to the back surface of the corresponding chip, wherein the heat sink of an upper chip package unit is connected to the thermal conductive layer of a lower chip package unit adjacent to the upper chip package unit, and the heat sink of the bottommost chip package unit is connected to at least one thermal conductive element of the carrying board.

24. The chip package structure as claimed in claim 22, wherein the substrate has a plurality of second thermal conductive vias located in the chip disposing region and connected to the back surface of the corresponding chip in each of the chip package units, wherein the second thermal conductive vias of an upper chip package unit are connected to the thermal conductive layer of a lower chip package unit adjacent to the upper chip package unit, and the second thermal conductive vias of the bottommost chip package unit are connected to at least one thermal conductive element of the carrying board.

25. The chip package structure as claimed in claim 24, wherein the second thermal conductive vias are solid structure or hollow structure.

26. The chip package structure as claimed in claim 22, wherein the thermal conductive layer of each of the chip package units contacts the active surface of the corresponding chip.

27. The chip package structure as claimed in claim 18, wherein the chip of each of the chip package units has an active surface and a back surface, the active surface of the chip faces toward the chip disposing region of the substrate, and the chip connects the connecting circuit via a plurality of first bumps by flip chip bonding.

28. The chip package structure as claimed in claim 27, wherein each of the chip package units further comprises a heat sink, the substrate of each of the chip package units having a second opening in the chip disposing region for exposing at least a portion of the active surface of the corresponding chip, the heat sink being disposed in the second opening and connected to the active surface of the corresponding chip through a plurality of second bumps, wherein the heat sink of an upper chip package unit is connected to the thermal conductive layer of a lower chip package unit adjacent to the upper chip package unit, and the heat sink of the bottommost chip package unit is connected to at least one thermal conductive element of the carrying board.

29. The chip package structure as claimed in claim 27, the substrate has a plurality of second thermal conductive vias located in the chip disposing region and connected to the active surface of the corresponding chip in each of the chip package units, each second thermal conductive via being connected to the active surface of the chip through a second bump, respectively, wherein the second thermal conductive vias of an upper chip package unit are connected to the thermal conductive layer of an lower chip package unit adjacent to the upper chip package unit, and the second thermal conductive vias of the bottommost chip package unit are connected to at least one thermal conductive elements of the carrying board.

30. The chip package structure as claimed in claim 29, wherein the second thermal conductive vias are solid structure or hollow structure.

31. The chip package structure as claimed in claim 27, wherein the thermal conductive layer of each of the chip package units contacts the back surface of the chip.

32. The chip package structure as claimed in claim 18, wherein the first thermal conductive vias of each of the chip package units are located around the connecting circuit and the signal vias.

33. The chip package structure as claimed in claim 18, wherein the carrying board further comprises a plurality of thermal conductive elements connected to the thermal conductive solder balls.

34. The chip package structure as claimed in claim 18, wherein the thermal conductive layer has a second opening for filling the molding compound.

\* \* \* \* \*